(12) United States Patent
Mizuno et al.

(10) Patent No.: US 10,132,575 B2
(45) Date of Patent: Nov. 20, 2018

(54) HEAT CONDUCTION MEMBER, PRODUCTION METHOD FOR HEAT CONDUCTION MEMBER, AND HEAT CONDUCTION STRUCTURE

(71) Applicant: Kitagawa Industries Co., Ltd., Aichi (JP)

(72) Inventors: Takashi Mizuno, Aichi (JP); Hideo Yumi, Aichi (JP)

(73) Assignee: KITAGAWA INDUSTRIES CO., LTD., Aichi (JP)

( * ) Notice: Subject to any disclaimer, the term of this patent is extended or adjusted under 35 U.S.C. 154(b) by 116 days.

(21) Appl. No.: 15/471,336

(22) Filed: Mar. 28, 2017

(65) Prior Publication Data

US 2017/0276442 A1  Sep. 28, 2017

(30) Foreign Application Priority Data

Mar. 28, 2016  (JP) .................. 2016-064262

(51) Int. Cl.

| F28F 13/18 | (2006.01) |
|---|---|
| F28F 21/06 | (2006.01) |
| F28F 21/08 | (2006.01) |
| H01L 23/31 | (2006.01) |
| H01L 23/373 | (2006.01) |

(52) U.S. Cl.
CPC .............. *F28F 13/18* (2013.01); *F28F 21/06* (2013.01); *F28F 21/089* (2013.01); *H01L 23/3121* (2013.01); *F28F 2275/12* (2013.01); *H01L 23/3735* (2013.01); *H01L 23/3736* (2013.01); *H01L 23/3737* (2013.01)

(58) Field of Classification Search
CPC .......... F28F 13/18; F28F 21/06; F28F 21/089; F28F 2275/12; H01L 23/3121; H01L 23/3735; H01L 23/3736; H01L 23/3737; H01L 23/12; H01L 23/14; H01L 23/50; H05K 1/09; B23K 31/02

USPC ........ 165/80.2; 174/256, 258, 259; 257/703, 257/705; 428/627, 621, 620, 210, 209, 428/660, 661, 675; 228/122.1, 123.1, 228/124.1, 124.5

See application file for complete search history.

(56) References Cited

U.S. PATENT DOCUMENTS

| 5,300,809 A * | 4/1994 | Nakamura .......... H01L 23/3735 257/684 |
|---|---|---|
| 6,261,703 B1 * | 7/2001 | Sasaki ................. H01L 23/3735 174/256 |
| 6,280,823 B1 * | 8/2001 | Preisler ................. B29C 43/021 280/728.3 |

(Continued)

FOREIGN PATENT DOCUMENTS

JP  201425028  2/2014

*Primary Examiner* — Justin Jonaitis
(74) *Attorney, Agent, or Firm* — Renner, Otto, Boisselle & Sklar, LLP (57) ABSTRACT

The heat conduction member comprises a laminate formed by laminating a resin layer and a metal layer. The resin layer is formed from a thermally conductive resin material. The thickness of the laminate is smaller at the peripheral edge of the laminate than in the center portion of the laminate, and the thickness of the laminate is greater in the intermediate portion of the laminate than in the center portion of the laminate. An inclined surface is formed on the laminate so as to form a falling gradient from the intermediate portion toward the peripheral edge.

10 Claims, 5 Drawing Sheets

(56) References Cited

U.S. PATENT DOCUMENTS

| | | | | |
|---|---|---|---|---|
| 6,280,861 B1 * | 8/2001 | Hosokawa | .......... | H01L 51/5206 |
| | | | | 257/91 |
| 6,969,640 B1 * | 11/2005 | Dimaano, Jr. | ........ | H01L 21/565 |
| | | | | 257/E21.504 |
| 2006/0147746 A1 * | 7/2006 | Wakako | .................. | H01L 33/60 |
| | | | | 428/627 |
| 2009/0065902 A1 * | 3/2009 | Yu | ........................ | H01L 21/3043 |
| | | | | 257/620 |
| 2013/0277097 A1 * | 10/2013 | Maeng | ..................... | H05K 1/09 |
| | | | | 174/257 |
| 2015/0282394 A1 * | 10/2015 | Yumi | ..................... | H05K 1/181 |
| | | | | 174/377 |
| 2015/0343769 A1 * | 12/2015 | Yoda | .................... | B41J 2/14233 |
| | | | | 347/50 |

* cited by examiner

HEAT CONDUCTION MEMBER, PRODUCTION METHOD FOR HEAT CONDUCTION MEMBER, AND HEAT CONDUCTION STRUCTURE

CROSS-REFERENCE TO RELATED APPLICATIONS

This application claims the benefit of Japanese Patent Application No. 2016-64262 filed on Mar. 28, 2016 with the Japan Patent Office, the entire disclosure of which is incorporated herein by reference.

BACKGROUND

The present disclosure relates to a heat conduction member, a production method for a heat conduction member, and a heat conduction structure.

In order to promote heat transfer from a first member to a second member, a member with a structure in which a thermally conductive resin layer and a metal layer are laminated is known as a thermally conductive member disposed between the two members (for example, see Japanese Unexamined Patent Application Publication No. 2014-25028A).

Such a heat conduction member is sandwiched between two members disposed on both sides in the lamination direction so as to transmit heat from a first heat-generating member (for example, an electronic part or the like) to a second member (for example, a case or the like for housing the electronic part).

SUMMARY

Incidentally, when disposing a heat conduction member between two members such as those described above, the heat conduction member can be easily sandwiched between the two members if the second member can be pressed toward the lamination direction of the heat conduction member after the heat conduction member is attached to the first member.

However, depending on the attachment structure of the second member with respect to the first member, it may not be possible to press the second member toward the lamination direction of the heat conduction member. For example, in the case of a structure in which the second member is attached by sliding with respect to the first member, the second member may also slide parallel to the surface of the heat conduction member. In this case, the second member slides from one end side of the metal layer on the surface of the heat conduction member to the other end side while making contact with the metal layer. Therefore, if the second member is caught on the end face of the metal layer, the metal layer may turn up, which may cause a decrease in heat conduction performance due to the metal layer not making proper contact with the second member. In addition, the metal layer can be prevented from turning up by adjusting the positional relationship between the second member and the heat conduction member so that the second member does not strongly rub against the heat conduction member, but in this case, the contact pressure between the second member and the heat conduction member decreases, which may also cause a decrease in heat conduction performance.

Due to the circumstances described above, there is a demand to provide a heat conduction member which, when disposing a member to make contact with a metal layer, can suppress the turning up of the metal layer even if the member moves in a direction that would cause the member to rub against the surface of the metal layer.

The heat conduction member described below comprises a laminate formed by laminating a resin layer and a metal layer; the resin layer being formed from a thermally conductive resin material prepared by forming a compound from a thermally conductive filler added to a resin material serving as a base material; a thickness of the laminate being smaller at a peripheral edge of the laminate than in a center portion of the laminate; a thickness of the laminate being greater in an intermediate portion between the center portion and the peripheral edge of the laminate than in the center portion of the laminate; and an inclined surface being formed in a range from the intermediate portion to the peripheral edge of the laminate so as to form a falling gradient from the intermediate portion toward the peripheral edge while the metal layer side faces upward.

With a heat conduction member configured in this way, an inclined surface is formed in the range from the intermediate portion to the peripheral edge so as to form a falling gradient from the intermediate portion toward the peripheral edge while the metal layer side faces upward. Therefore, even if the second member is slid to a position making contact with the metal layer after the heat conduction member is attached to the first member, the heat conduction member can make contact with the second member along the inclined surface, so the second member does not become caught on the end face of the metal layer. Accordingly, the metal layer does not turn up as the second member and the metal layer make contact, and the metal layer can be properly brought into contact with the second member, as a result, the heat conduction member can be made to exhibit good heat conduction performance. In addition, since the thickness of the laminate is greater in the intermediate portion between the center portion and the peripheral edge of the laminate than the center portion or the peripheral edge of the laminate, the contact pressure with respect to the second member can be increased. Therefore, the heat conduction performance can be enhanced in comparison to that of a flat heat conduction member that does not have such a thick portion.

In addition, the production method for a heat conduction member described below comprises the following steps: a first step of producing a composite sheet by laminating a resin sheet formed from a thermally conductive resin material prepared by forming a compound from a thermally conductive filler added to a resin material serving as a base material, a thickness being not less than 1 mm and not greater than 3 mm, and a hardness of the sheet being not less than 5 and not greater than 40 in terms of Asker C hardness, and a metal sheet having a thickness of not less than 100 μm and not greater than 500 μm; and a second step of producing a plurality of laminates by pressing a blade into the composite sheet toward the lamination direction from the metal sheet side and cutting the composite sheet so that each laminate has a structure in which the resin layer and the metal layer are laminated; in the second step, a thickness of the laminate being smaller at a peripheral edge of the laminate than in a center portion of the laminate; a thickness of the laminate being greater in an intermediate portion between the center portion and the peripheral edge of the laminate than in the center portion of the laminate; and an inclined surface being formed in a range from the intermediate portion to the peripheral edge of the laminate so as to form a falling gradient from the intermediate portion toward the peripheral edge while the metal layer side faces upward.

With such a production method for a heat conduction member, the heat conduction member of the present disclosure can be easily produced.

In addition, the heat conduction structure described below comprises a first member having a heat-generating part on at least one face thereof, and a heat conduction member attached to the first member so as to make contact with the heat-generating part; the heat conduction member comprising a laminate formed by laminating a resin layer and a metal layer; the resin layer being formed from a thermally conductive resin material prepared by forming a compound from a thermally conductive filler added to a resin material serving as a base material; the heat conduction member being configured so as to make contact with the heat-generating part and the first member on a resin layer side and so that it can make contact with a second member on a metal layer side; the heat conduction member having a shape so that, when the metal layer side faces upward while the heat conduction member is attached to the first member, a peripheral edge of the laminate is disposed at a position lower than a center portion of the laminate, and an intermediate portion between the center portion and the peripheral edge of the laminate is disposed at a higher position than the center portion of the laminate; and an inclined surface being formed in a range from the intermediate portion to the peripheral edge of the laminate so as to form a falling gradient from the intermediate portion of the laminate toward the peripheral edge while the metal layer side faces upward.

With a heat conduction structure configured in this way, an inclined surface is formed in the range from the intermediate portion to the peripheral edge so as to form a falling gradient from the intermediate portion toward the peripheral edge while the metal layer side faces upward. Therefore, even if the second member is slid to a position making contact with the metal layer, the heat conduction member can make contact with the second member along the inclined surface, as a result, the second member does not become caught on the end face of the metal layer. Accordingly, the metal layer does not turn up as the second member and the metal layer make contact, and the metal layer can be properly brought into contact with the second member, as a result, the heat conduction member can be made to exhibit good heat conduction performance. In addition, the peripheral edge of the laminate is disposed at a lower position than the center portion of the laminate, and the intermediate portion between the center portion and the peripheral edge of the laminate is disposed at a higher position than the center portion of the laminate. The "lower position" described here means that when the metal layer side faces upward while attached to the first member, the position of the peripheral edge is disposed below the center portion in the vertical direction. However, for a direction perpendicular to the vertical direction, the center portion and the peripheral edge are at different positions, so this does not mean that the position of the peripheral edge is directly below the center portion.

Similarly, the "higher position" described here means that when the metal layer side faces upward while attached to the first member, the position of the intermediate portion is disposed above the center portion or the peripheral edge in the vertical direction. However, for a direction perpendicular to the vertical direction, the center portion, the peripheral edge, and the intermediate portion are at different positions, so this does not mean that the position of the intermediate portion is directly above the center portion or the peripheral edge. When the intermediate portion projects to a higher position than the center portion or the peripheral edge in this way, it is possible to increase the contact pressure with respect to the second member. Therefore, the heat conduction performance of the heat conduction member can be enhanced in comparison to that of an electronic circuit board to which a flat heat conduction member that does not have a portion disposed at such a high position is attached.

DETAILED DESCRIPTION OF THE PREFERRED EMBODIMENTS

Next, the heat conduction member described above will be explained using an exemplary embodiment.

Configuration of the Heat Conduction Member

Figure 1A:
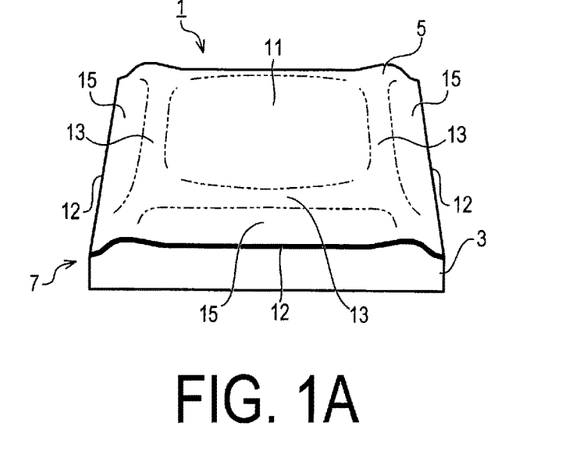
FIG. 1A is a perspective view of a heat conduction member.
Figure 1B:
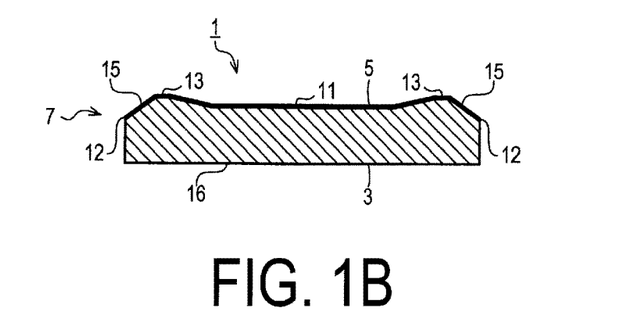
FIG. 1B is a severed end view of the center of the heat conduction member.

As illustrated in FIGS. 1A and 1B, a heat conduction member 1 has a laminate 7 formed by laminating a resin layer 3 and a metal layer 5. The resin layer 3 is formed from a thermally conductive resin material prepared by forming a compound from a thermally conductive filler added to a resin material serving as a base material. The hardness of the resin layer 3 is not less than 5 and not greater than 40 in terms of Asker C hardness.

A specific example of such a thermally conductive resin material is the resin material disclosed in Japanese Patent No. 4679383 (Asker C hardness of about 18, for example) or the resin material disclosed in Japanese Patent No. 5223149 (Asker C hardness of about 8, for example). However, the composition of the thermally conductive resin material is not limited to the examples listed above. Any publicly known thermally conductive resin material may be used as long as it is within a range satisfying the conditions prescribed by the present disclosure, and the specific components, composition ratios, or the like thereof may also be adjusted or optimized as necessary.

For example, both thermoplastic elastomers and thermosetting elastomers (for example, synthetic rubber or natural rubber) may be used as a base material of the thermally conductive resin material. Specific examples of thermoplastic elastomers include various thermoplastic elastomers such as styrene elastomers, olefin elastomers, ester elastomers, amide elastomers, and urethane elastomers, and hydrogenated or otherwise modified products of these various thermoplastic elastomers may also be used. Specific examples of thermosetting elastomers include styrene-butadiene rubber, butadiene rubber, chloroprene rubber, nitrile-butadiene rubber, butyl rubber, urethane rubber, silicone rubber, fluorine rubber, and acrylic rubber. These elastomer materials may be used alone, or two or more compatible types may be blended and used.

Examples of the thermally conductive filler compounded into the base material include fillers such as alumina and magnesia. The degree to which the thermal conductivity should be secured may be adjusted as necessary in accordance with the purpose, but the elastomer part, for example, should have a thermal conductivity of not less than 1 W/m·K. Alternatively, a filler functioning as a heat-radiating material may be compounded, and examples thereof include fillers such as silicon carbide, aluminum hydroxide, and magnesium hydroxide. The degree to which the thermal emissivity should be secured may be adjusted as necessary in accordance with the purpose, but the thermal emissivity should be set, for example, to not less than 0.8.

Figure 1C:
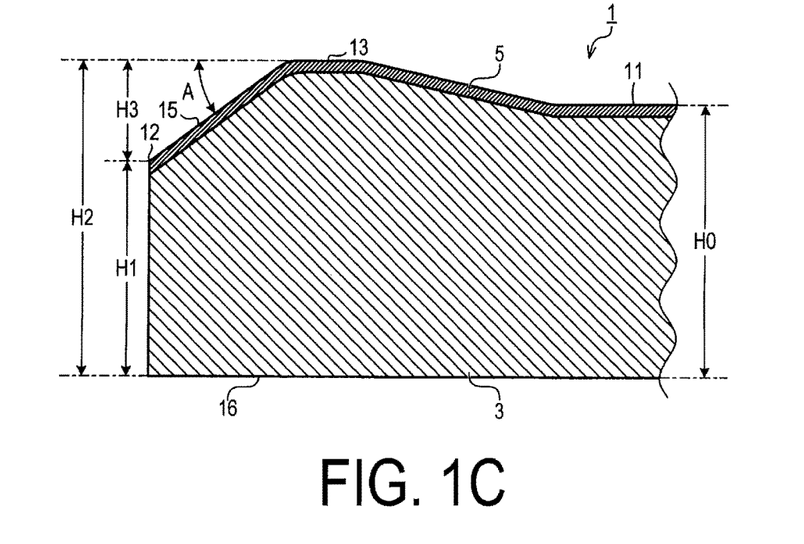
FIG. 1C is a magnified view of parts of the areas illustrated in FIG. 1B.

The metal layer 5 is formed from aluminum or an aluminum alloy. In the illustrated embodiment, the thickness of the metal layer 5 is not less than 100 μm and not greater than 500 μm. In the center portion 11 of the laminate 7, the thickness of the resin layer 3 is not less than 1 mm and not greater than 3 mm. At the peripheral edge 12 of the laminate 7, as illustrated in FIG. 1C, the thickness H1 of the laminate 7 is smaller than the thickness H0 of the center portion 11 of the laminate 7. In an intermediate portion 13 between the center portion 11 and the peripheral edge 12 of the laminate 7, the thickness H2 of the laminate 7 is greater than the thickness H0 of the center portion 11 of the laminate 7. As a result, an inclined surface 15 is formed in the range from the intermediate portion 13 to the peripheral edge 12 of the laminate 7 so as to form a falling gradient from the intermediate portion 13 toward the peripheral edge 12 while the metal layer 5 side faces upward. An adhesive surface 16 of the resin layer 3 described above on the opposite side of the metal layer 5 is formed into a flat shape. The inclined surface 15 is formed so as to have a slope of not less than 20 degrees and not greater than 50 degrees with respect to the adhesive surface 16 formed into a flat shape. That is, the angle of inclination A illustrated in FIG. 1C is not less than 20 degrees and not greater than 50 degrees.

Production Method of the Heat Conduction Member

Next, the production method of the heat conduction member 1 will be described. The heat conduction member 1 can be produced with a method such as that described below.

Figure 2A:
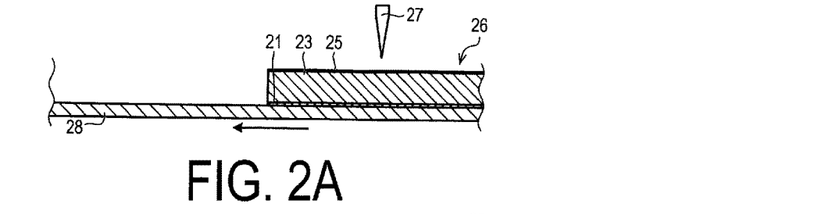
FIG. 2A is an explanatory diagram illustrating a state prior to the cutting of the composite sheet.

First, as illustrated in FIG. 2A, a composite sheet 26 is produced by laminating a release sheet 21, a thermally conductive resin sheet 23, and a metal sheet 25. The thermally conductive resin sheet 23 used here is formed from a thermally conductive resin material prepared by forming a compound from a thermally conductive filler added to a resin material serving as a base material. In addition, the thermally conductive resin sheet 23 is prepared so that the thickness is not less than 1 mm and not greater than 3 mm and so that the hardness of the sheet is not less than 5 and not greater than 40 in terms of Asker C hardness. The metal sheet 25 is an aluminum sheet or an aluminum alloy sheet having a thickness of not less than 100 μm and not greater than 500 μm. The release sheet 21 is for forming a release layer to be peeled before the heat conduction member 1 is used, and in this embodiment, a PET (polyethylene terephthalate) film is used.

Any publicly known technique may be used as a specific lamination method when producing the composite sheet 26. For example, the release sheet 21 may be further laminated after a raw material composition of the thermally conductive resin sheet 23 that has not been crosslinked (that is, not hardened) is laminated on the metal sheet 25 using a coater. The composite sheet 26 may then be completed by crosslinking (that is, hardening) the raw material composition of the thermally conductive resin sheet 23 so as to produce the thermally conductive resin sheet 23. Alternatively, the raw material composition of the thermally conductive resin sheet 23 may be crosslinked (that is, hardened) so as to produce the thermally conductive resin sheet 23, and the release sheet 21 and the metal sheet 25 may be laminated on the thermally conductive resin sheet 23.

Figure 2B:
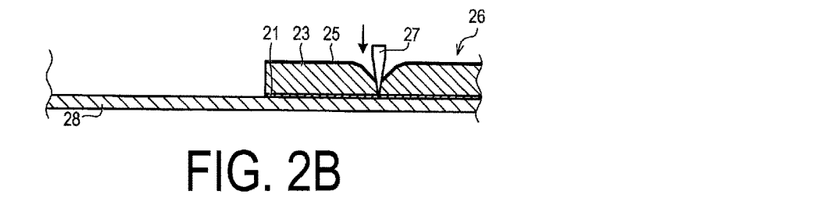
FIG. 2B is an explanatory diagram illustrating a state during the cutting of the composite sheet.
Figure 2C:
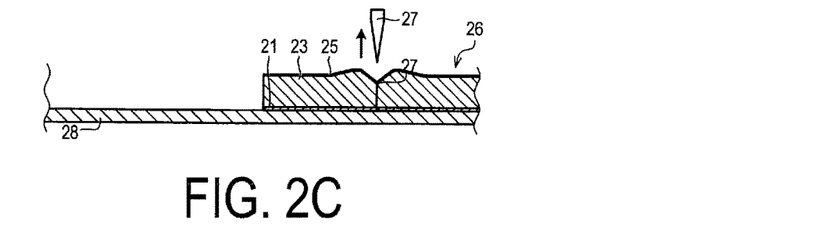
FIG. 2C is an explanatory diagram illustrating a state after the cutting of the composite sheet.
Figure 2D:
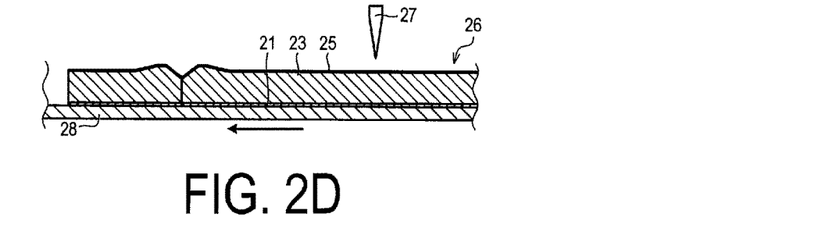
FIG. 2D is an explanatory diagram illustrating a state after the composite sheet has been moved to the next cutting position.
Figure 2E:
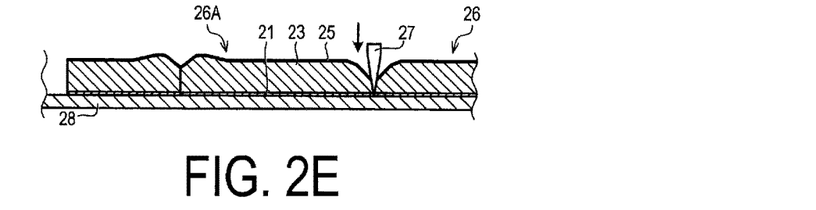
FIG. 2E is an explanatory diagram illustrating a state during the cutting of the composite sheet at the next cutting position.
Figure 2F:
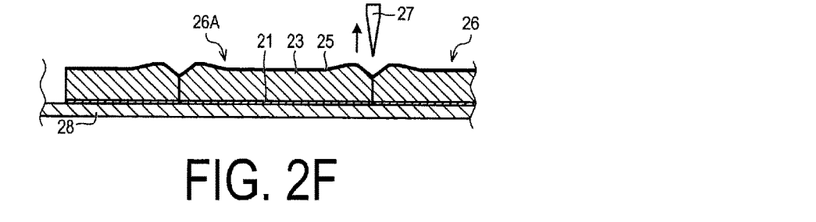
FIG. 2F is an explanatory diagram illustrating a state after the cutting of the composite sheet at the next cutting position.

As illustrated in FIG. 2A, the composite sheet 26 produced with such a method is set in a cutting device equipped with a blade 27 and a conveying part 28. The composite sheet 26 is conveyed by the conveying part 28 in prescribed increments (for example, 25 mm) in the conveying direction indicated by the arrow in FIG. 2A. Once the composite sheet 26 has been conveyed to the position indicated in FIG. 2A, the blade 27 of the cutting device is then lowered, as illustrated in FIG. 2B, and the blade 27 is pressed against the composite sheet 26 toward the lamination direction from the metal sheet 25 side so as to cut the composite sheet 26. The blade 27 is then raised, as illustrated in FIG. 2C. Next, as illustrated in FIG. 2D, the conveying part 28 is operated so as to convey the composite sheet 26 by a prescribed amount (for example, 25 mm) in the conveying direction indicated by the arrow in FIG. 2D. The blade 27 is then lowered so as to cut the composite sheet 26, as illustrated in FIG. 2E, and the blade 27 is then raised, as illustrated in FIG. 2F. As a result, the composite sheet 26 is cut out to a prescribed width (for example, 25 mm). By repeating the cutting process described above, the composite sheet 26 is cut out into a plurality of strips 26A arranged in a row. The plurality of strips 26A are then rotated 90 degrees relatively with respect to the blade 27, and the cutting process is further performed with the blade 27. As a result, a laminate 7 serving as the heat conduction member 1 is cut out.

As a result of the cutting process described above, the thickness of the laminate 7 at the peripheral edge 12 of the laminate 7 is less than in the center portion 11 of the laminate 7, and the thickness of the laminate 7 in the intermediate portion 13 between the center portion 11 and the peripheral edge 12 of the laminate 7 is greater than in the center portion 11 of the laminate 7. In addition, an inclined surface 15 is formed in the range from the intermediate portion 13 to the peripheral edge 12 of the laminate 7 so as to form a falling gradient from the intermediate portion 13 toward the peripheral edge 12 while the metal layer 5 side faces upward. This is because, as described above, the thickness of the metal sheet 25 is not less than 100 μm and not greater than 500 μm, while the thickness of the thermally conductive resin sheet 23 is not less than 1 mm and not greater than 3 mm, and the hardness of the thermally conductive resin sheet 23 is not less than 5 and not greater than 40 in terms of Asker C hardness. That is, by producing the laminate 7 with such a material, it is possible to produce a heat conduction member 1 having a prescribed shape.

Incidentally, in the production method described above, when the thickness of the thermally conductive resin sheet 23 is less than 1 mm, the crushing margin of the resin layer 3 becomes too small, so it tends to become difficult to make the gradient of the inclined surface 15 sufficiently large. When the thickness of the thermally conductive resin sheet 23 exceeds 3 mm, the gradient of the inclined surface 15 can be made sufficiently large, but the heat conduction member 1 becomes thick, which is not advantageous from the perspective of heat transfer. Therefore, the thickness of the thermally conductive resin sheet 23 is preferably not less than 1 mm and not greater than 3 mm from these perspectives.

In addition, when the thickness of the metal sheet 25 is less than 100 μm, the flexural rigidity of the metal layer 5 becomes low, so the restoring force due to the elasticity of the resin layer 3 becomes relatively strong, and it tends to become difficult to make the gradient of the inclined surface 15 sufficiently large. When the thickness of the metal sheet 25 exceeds 500 μm, the rigidity of the metal layer 5 becomes high, so the adhesion of the metal layer 5 to the contact target tends to decrease, or the metal sheet 25 tends to become difficult to cut. Therefore, the thickness of the metal sheet 25 is preferably not less than 100 μm and not greater than 500 μm from these perspectives.

Further, when the hardness of the thermally conductive resin sheet 23 is lower than 5 in terms of Asker C hardness, the shape stability of the resin layer 3 becomes low, and the shape of the metal layer 5 after cutting also tends to become unstable. When the hardness of the thermally conductive resin sheet 23 exceeds 40 in terms of Asker C hardness, the elasticity of the resin layer 3 becomes relatively strong, and it tends to become difficult to make the gradient of the inclined surface 15 sufficiently large. Therefore, the hardness of the thermally conductive resin sheet 23 is preferably adjusted to not less than 5 and not greater than 40 in terms of Asker C from these perspectives.

In the example described above, a release sheet 21 was provided, but whether to provide a release sheet 21 is optional, and whether to further laminate layers other than the release sheet 21 is also optional. For example, when the adhesiveness of the surface of the resin layer 3 is low, an adhesive layer may be provided on the surface of the resin layer 3, and a release layer may be provided on the surface of the adhesive layer. That is, the heat conduction member 1 may also have a structure in which layers having other functions are further laminated as long as the heat conduction member 1 includes the laminate 7 formed by laminating the resin layer 3 and the metal layer 5.

In addition, in the example described above, cutting processing was performed with a cutting device equipped with a blade 27 and a conveying part 28, but the matter of what type of cutting device to use is optional. For example, the configuration may be such that a plurality of strips are cut out in a single cutting operation by using a cutting device in which a plurality of blades 27 are arranged in parallel. Alternatively, a blade unit in which vertical blades and horizontal blades are arranged in a lattice shape may be used so as to cut out laminates 7 with a plane-view square shape in a single cutting operation without performing the aforementioned operation of rotating the device by 90 degrees. In addition, laminates of shapes other than a plane-view square shape may also be punched out.

Method of Using the Heat Conduction Member

Figure 3A:
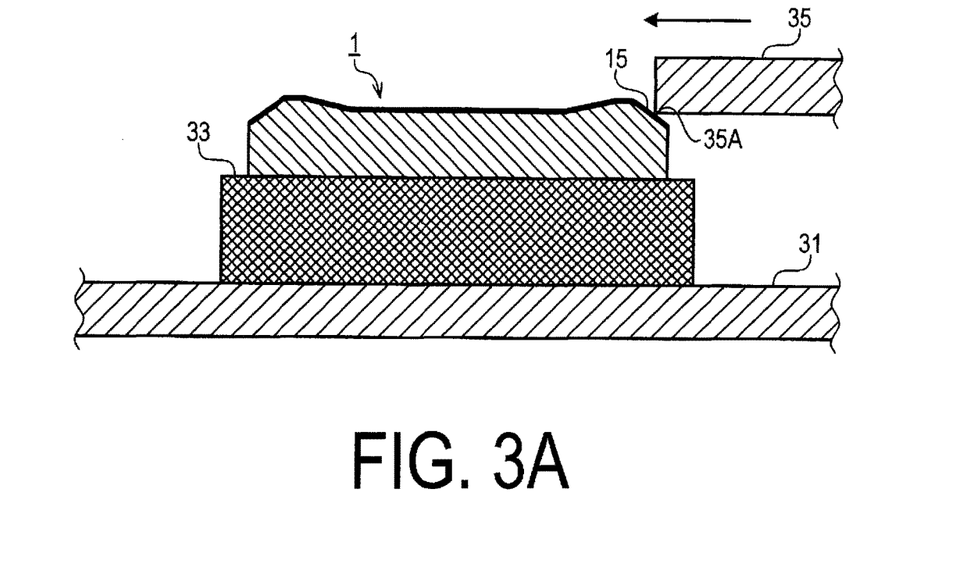
FIG. 3A is an explanatory diagram illustrating a state at the moment when a panel comes into contact with the heat conduction member.
Figure 3B:
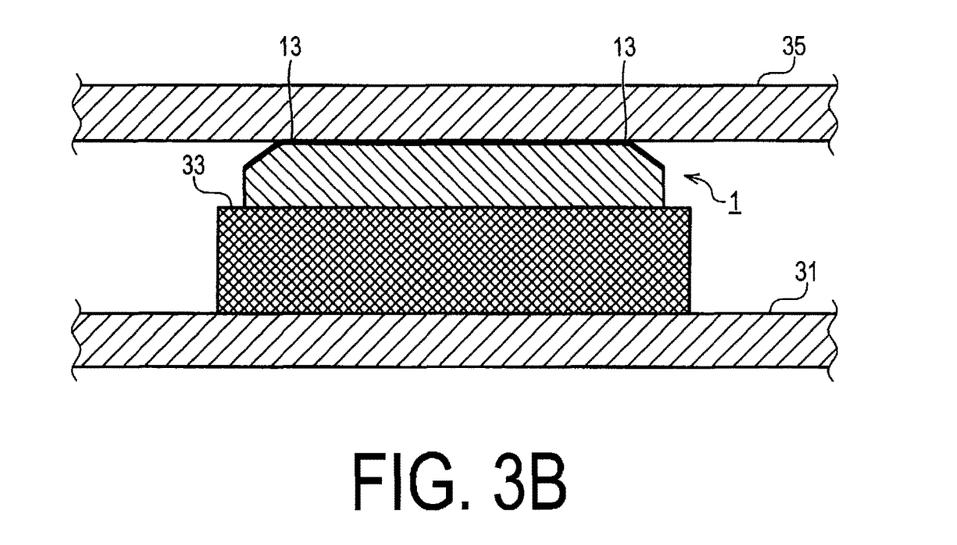
FIG. 3B is an explanatory diagram illustrating a state in which the heat conduction member is sandwiched between an electronic part and the panel.

As illustrated in FIGS. 3A and 3B, the heat conduction member 1 described above is attached to a heat-generating electronic part 33 mounted on an electronic circuit board 31, for example. In addition, a panel 35 of a case (not illustrated) for housing the electronic part 33 makes contact with such a heat conduction member 1. The panel 35 slides in the direction indicated by the arrow in FIG. 3A and is disposed at a position such as that illustrated in FIG. 3B. When the electronic part 33 generates heat in a state in which the panel is disposed at a position such as that illustrated in FIG. 3B, the heat is transmitted to the panel 35 via the heat conduction member 1. Therefore, the heat of the electronic part 33 can escape to the panel 35, which makes it possible to prevent the electronic part 33 from being damaged by heat or to prevent the performance from decreasing.

In addition, as described above, when the panel 35 is slid, the metal layer 5 of the heat conduction member 1 is rubbed by the panel 35. However, when the panel 35 makes contact with the heat conduction member 1 as illustrated in FIG. 3A, the slide direction tip part 35A of the panel 35 makes contact with the inclined surface 15 of the heat conduction member 1. Therefore, the slide direction tip part 35A of the panel 35 does not get caught on the end face of the heat conduction member 1. Accordingly, the metal layer 5 does not turn up as the panel 35 and the metal layer 5 make contact, and the metal layer 5 can be properly brought into contact with the panel 35. Therefore, the heat conduction member 1 can be made to exhibit good heat conduction performance in comparison to a flat heat conduction member in which the metal layer 5 tends to turn up.

The thickness of the laminate 7 in the center portion 11 of the laminate 7 is slightly greater than the spacing between the electronic part 33 and the panel 35. In addition, the thickness of the laminate 7 in the intermediate portion 13 of the laminate 7 is greater than in the center portion 11 of the laminate 7. Therefore, when the heat conduction member 1 is sandwiched between the electronic part 33 and the panel 35, the heat conduction member 1 is slightly compressed in the center portion 11 of the laminate 7 so that the heat conduction member 1 is adhered to the panel 35. In addition, the heat conduction member 1 is compressed in the intermediate portion 13 of the laminate 7 to a greater degree than in the center portion 11, and the heat conduction member 1 is adhered more strongly to the panel 35 in this portion. That is, the contact pressure of the heat conduction member 1 with respect to the panel 35 can be increased in the intermediate portion 13. Therefore, the adhesion to the panel 35 can be increased and the heat conduction performance can be enhanced in comparison to a flat heat conduction member that does not have such a thick portion (portion corresponding to the intermediate portion 13 described above). In addition, when the intermediate portion 13 is pressed and crushed by the panel 35, the density of the resin layer 3 becomes high in this portion, and the thermal conductivity of this portion is enhanced, which makes it possible to enhance the heat conduction performance.

Note that the structure formed by such an electronic circuit board 31, electronic part 33, and heat conduction member 1 corresponds to an example of the heat conduction structure described in the present disclosure.

Performance Evaluation

Next, test samples were prepared by varying the dimensions of each part and the characteristics of the materials of the heat conduction member 1 described above, and performance evaluations of each of the samples were performed. More specifically, the thickness of the metal layer 5 was first tested in four levels—50 μm, 100 μm, 200 μm, and 500 μm. An attempt was also made to set the thickness of the metal layer 5 to 1000 μm. However, the cutting process could not be performed appropriately by the blade 27 described above, so this was withheld from use for evaluations. In addition, the thickness of the resin layer 3 was tested in three levels—1 mm, 2 mm, and 3 mm. The hardness of the resin layer 3 was tested in four levels—5, 18, 40, and 70—in terms of Asker C hardness.

By appropriately combining these conditions, the 33 test samples shown in Table 1 below were prepared, and laminates 7 serving as heat conduction members 1 were produced. The angle of inclination A (see FIG. 1C) of the inclined surface 15 formed on each was then measured. When this angle of inclination is too small, the metal layer 5 tends to turn up easily, so the angle of inclination A is preferably not less than degrees from this perspective.

However, when the angle of inclination is too large, the slide direction tip part 35A of the panel 35 touches the inclined surface 15, and the sliding of the panel 35 is thereby obstructed, so the angle of inclination A is preferably not greater than 50 degrees from this perspective. Therefore, cases in which the angle of inclination A is not less than 30 degrees and not greater than 50 degrees were designated as evaluation A, which is the best evaluation. In addition, even if the angle of inclination is slightly smaller than 30 degrees, it is often not problematic from a practical standpoint, so cases in which the angle of inclination A is not less than 20 degrees and less than 30 degrees from this perspective were designated as evaluation B, which is the next best evaluation after evaluation A. Further, when the angle of inclination is less than 20 degrees, the metal layer 5 tends to turn up easily, so such cases were designated as evaluation C, which is a lower evaluation than evaluation B. The evaluation results are shown in Table 1.

TABLE 1

| | No. | | | | | | | | | | |
|---|---|---|---|---|---|---|---|---|---|---|---|
| | 1 | 2 | 3 | 4 | 5 | 6 | 7 | 8 | 9 | 10 | 11 |
| Thickness of the metal layer (μm) | 50 | 50 | 50 | 100 | 100 | 100 | 100 | 200 | 200 | 200 | 500 |
| Thickness of the resin layer (mm) | 1 | 1 | 1 | 1 | 1 | 1 | 1 | 1 | 1 | 1 | 1 |
| Hardness of the resin layer (ASKER C) | 5 | 18 | 40 | 5 | 18 | 40 | 70 | 5 | 18 | 40 | 5 |
| Peripheral edge part angle of inclination evaluation | C | C | C | A | B | B | C | A | A | A | A |

| | No. | | | | | | | | | | |
|---|---|---|---|---|---|---|---|---|---|---|---|
| | 12 | 13 | 14 | 15 | 16 | 17 | 18 | 19 | 20 | 21 | 22 |
| Thickness of the metal layer (μm) | 50 | 50 | 50 | 100 | 100 | 100 | 100 | 200 | 200 | 200 | 500 |
| Thickness of the resin layer (mm) | 2 | 2 | 2 | 2 | 2 | 2 | 2 | 2 | 2 | 2 | 2 |
| Hardness of the resin layer (ASKER C) | 5 | 18 | 40 | 5 | 18 | 40 | 70 | 5 | 18 | 40 | 5 |
| Peripheral edge part angle of inclination evaluation | C | C | C | A | A | A | C | A | A | A | A |

| | No. | | | | | | | | | | |
|---|---|---|---|---|---|---|---|---|---|---|---|
| | 23 | 24 | 25 | 26 | 27 | 28 | 29 | 30 | 31 | 32 | 33 |
| Thickness of the metal layer (μm) | 50 | 50 | 50 | 100 | 100 | 100 | 100 | 200 | 200 | 200 | 500 |
| Thickness of the resin layer (mm) | 3 | 3 | 3 | 3 | 3 | 3 | 3 | 3 | 3 | 3 | 3 |
| Hardness of the resin layer (ASKER C) | 5 | 18 | 40 | 5 | 18 | 40 | 70 | 5 | 18 | 40 | 5 |
| Peripheral edge part angle of inclination evaluation | C | C | C | A | A | A | C | A | A | A | A |

Peripheral edge part angle of inclination evaluation:
A . . . not less than 30 degrees and not greater than 50 degrees, B . . . not less than 20 degrees and less than 30 degrees, C . . . less than 20 degrees From the evaluation results shown in Table 1, it can be seen that when the thickness of the metal layer 5 is 50 μm, the angle of inclination becomes small, resulting in evaluation C. This may be because, since the rigidity of the metal layer 5 is low, the elastic force of the resin layer 3 becomes relatively strong, so the metal layer 5 cannot maintain a state of plastic deformation at the prescribed angle of inclination.

In addition, it can be seen that when the hardness of the resin layer 3 is 70 in terms of Asker C hardness, the angle of inclination becomes small, resulting in evaluation C. This may be because, since the elasticity of the resin layer 3 is low, the elastic force of the resin layer 3 becomes relatively strong, so the metal layer 5 cannot maintain a state of plastic deformation at the prescribed angle of inclination. Therefore, it can be seen from these evaluation results that by appropriately adjusting the thickness of the metal layer 5 and the hardness of the resin layer 3, it is possible to give the laminate 7 an inclined surface 15 having a prescribed angle of inclination by simply cutting the composite sheet 26.

Next, test sample No. 15 and test sample No. 19 in Table 1 above were selected, and the thermal resistance of each was measured. This measurement was performed with the measurement method according to the US Standard ASTM D5470. The size of the test pieces was 25 mm squared from a plan view. The applied power on the heat source side was 20 W. The measurement results are shown in Table 2.

TABLE 2

|  | No. | |
| --- | --- | --- |
|  | 15 | 19 |
| Thickness of the metal layer (μm) | 100 | 200 |
| Thickness of the resin layer (mm) | 2 | 2 |
| Hardness of the resin layer (ASKER C) | 5 | 5 |
| Thermal resistance (° C./W) | 2.24 | 2.49 |

It can be seen from the measurement results shown in Table 2 that test sample No. 15 and test sample No. 19 exhibit extremely low thermal resistance. Therefore, by using test sample No. 15 and test sample No. 19, it is possible to transfer the heat of the electronic part 33 to the panel 35 quickly. As described above, the thickness of the metal layer 5 should be set to within the range of from not less than 100 μm to 500 μm, but when the thickness of the metal layer 5 is not greater than 200 μm, the metal layer 5 tends to follow the shape of the panel 35 and becomes deformed. Therefore, when the heat conduction member 1 is used in a location where it is required to follow the contact surface, such as a location where a level difference arises in the panel 35, setting the thickness of the metal layer 5 to not less than 100 μm and not greater than 200 μm is even more preferable from the perspective of being able to adhere the metal layer 5 to the contact surface.

Next, the height and insertion of the inclined surface 15 were evaluated. The height of the inclined surface 15 refers to the height H3 illustrated in FIG. 1C. When this height is too small, the metal layer 5 tends to turn up easily, so the height H3 is preferably not less than 0.5 mm from this perspective. Therefore, cases in which the height H3 is not less than 0.5 mm were designated as evaluation A, which is the best evaluation, and cases in which the height H3 is less than 0.5 mm were designated as evaluation C, which is a lower evaluation than evaluation A.

Figure 4A:
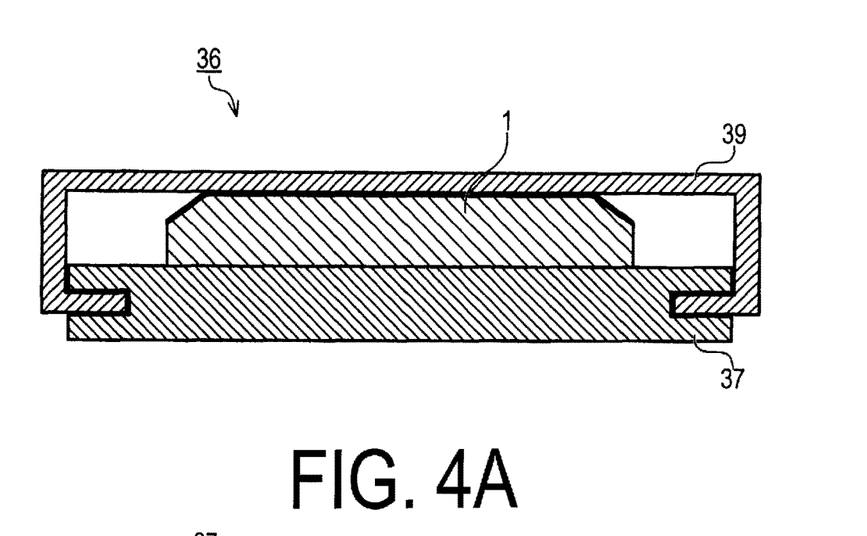
FIG. 4A is an explanatory diagram illustrating a test instrument for testing the ease of inserting a second part.
Figure 4B:
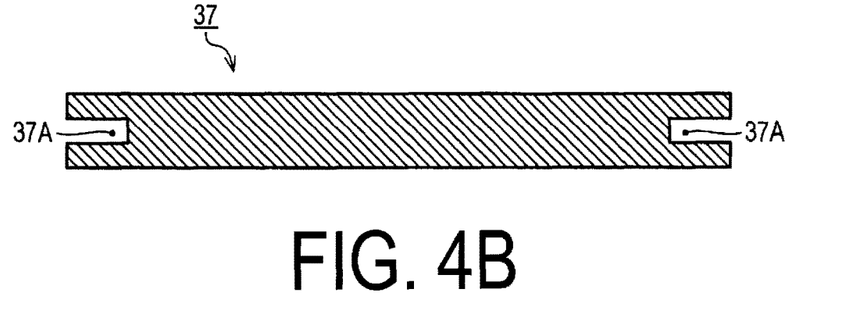
FIG. 4B is an explanatory diagram illustrating a first part of the test instrument illustrated in FIG. 4A.
Figure 4C:
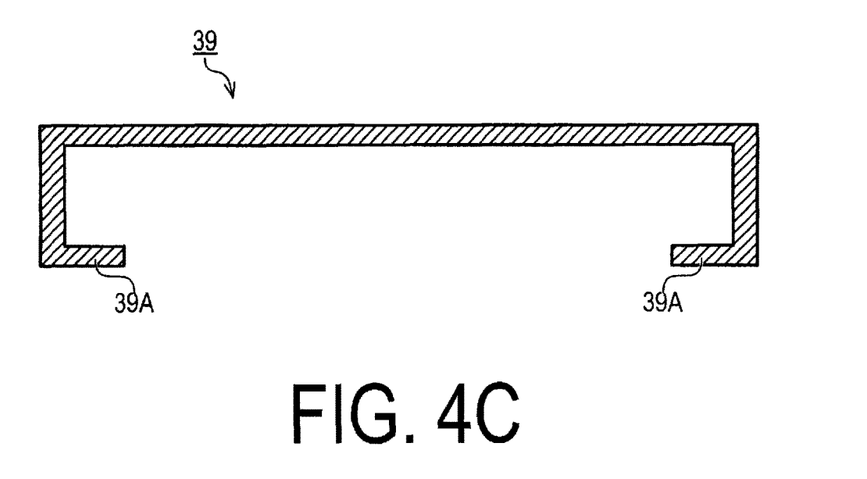
FIG. 4C is an explanatory diagram illustrating a second part of the test instrument illustrated in FIG. 4A.

Insertion was evaluated using a test instrument 36 such as that illustrated in FIG. 4A. This test instrument 36 comprises a first part 37 to which the heat conduction member 1 is attached, and a second part 39 capable of sliding with respect to the first part 37. As illustrated in FIG. 4B, grooves 37A and 37A extending in a direction perpendicular to the page are formed at both ends of the first part 37. In addition, as illustrated in FIG. 4C, protrusions 39A and 39A which fit into the grooves 37A and 37A of the first part 37 are provided on the second part 39. After the heat conduction member 1 is attached to the first part 37, the second part 39 is attached to the first part 37, and when the second part 39 is slid in the direction in which the grooves 37A and 37A extend, the second part 39 rubs against the metal layer 5 of the heat conduction member 1. The operation of sliding the second part 39 was repeated ten times using such a test instrument 36, and the number of times that deformations were observed in the metal layer 5 was confirmed. As a result of this confirmation, cases in which there were 0 deformations were designated as evaluation A, which is a good evaluation, and cases in which there were 1 or more deformations were designated as evaluation C, which is a lower evaluation than evaluation A. The evaluation results are shown in Table 3.

TABLE 3

|  | No. | | | | | |
| --- | --- | --- | --- | --- | --- | --- |
|  | 1 | 4 | 5 | 6 | 7 | 8 |
| Thickness of the metal layer (μm) | 50 | 100 | 100 | 100 | 100 | 200 |
| Thickness of the resin layer (mm) | 1 | 1 | 1 | 1 | 1 | 1 |
| Hardness of the resin layer (ASKER C) | 5 | 5 | 18 | 40 | 70 | 5 |
| Angle of inclination of the inclined surface (degrees) | 5.0 | 30.0 | 18.0 | 15.0 | 5.0 | 35.0 |
| Height of the inclined surface (mm) | 0.15 | 0.65 | 0.55 | 0.50 | 0.10 | 0.60 |
| Height evaluation of the inclined surface | C | A | A | A | C | A |
| Insertion evaluation | C | A | A | A | C | A |

|  | No. | | | | | |
| --- | --- | --- | --- | --- | --- | --- |
|  | 12 | 15 | 16 | 17 | 18 | 19 |
| Thickness of the metal layer (μm) | 50 | 100 | 100 | 100 | 100 | 200 |
| Thickness of the resin layer (mm) | 2 | 2 | 2 | 2 | 2 | 2 |
| Hardness of the resin layer (ASKER C) | 5 | 5 | 18 | 40 | 70 | 5 |
| Angle of inclination of the inclined surface (degrees) | 13.1 | 45.6 | 33.0 | 32.8 | 12.2 | 46.1 |
| Height of the inclined surface (mm) | 0.21 | 0.88 | 0.63 | 0.58 | 0.16 | 0.9 |

TABLE 3-continued

|  | | | | | | |
|---|---|---|---|---|---|---|
| Height evaluation of the inclined surface | C | A | A | A | C | A |
| Insertion evaluation | C | A | A | A | C | A |

| | No. | | | | | |
|---|---|---|---|---|---|---|
| | 23 | 26 | 27 | 28 | 29 | 30 |
| Thickness of the metal layer (μm) | 50 | 100 | 100 | 100 | 100 | 200 |
| Thickness of the resin layer (mm) | 3 | 3 | 3 | 3 | 3 | 3 |
| Hardness of the resin layer (ASKER C) | 5 | 5 | 18 | 40 | 70 | 5 |
| Height evaluation of the inclined surface | C | A | A | A | C | A |
| Insertion evaluation | C | A | A | A | C | A |

Height evaluation of the inclined surface: A . . . not less than 0.5 mm, C . . . less than 0.5 mm Insertion evaluation: A . . . 0 deformations of the metal layer, C . . . 1 or more deformations of the metal layer From the evaluation results shown in Table 3, it can be seen that when the thickness of the metal layer 5 is 50 μm and when the hardness of the resin layer 3 is 70 in terms of Asker C hardness, the height H3 is less than 0.5 mm, resulting in evaluation C. In addition, in these cases, the deformation of the metal layer 5 is also observed in insertion tests, resulting in evaluation C. For several test samples in Table 3, the actual measurements of the height of the inclined surface 15 and the angle of inclination of the inclined surface 15 were recorded together. It can be seen from these evaluation results that by appropriately adjusting the thickness of the metal layer 5 and the hardness of the resin layer 3, it is possible to normalize the height of the inclined surface 15 of the laminate 7 and to achieve good insertion by simply cutting the composite sheet 26.

Configuration Method for the Heat Conduction Structure

In the example described above, a heat conduction member 1 formed into a prescribed shape in advance was first produced, and the heat conduction member 1 was then attached to the electronic part 33. However, a heat conduction member 1 having a prescribed shape may also be configured with a different procedure than that of the example described above. For example, by first attaching a laminate 7 to an electronic circuit board 31 and then molding the laminate 7, a heat conduction member 1 having a prescribed shape may be formed on the electronic circuit board 31.

Figure 5A:
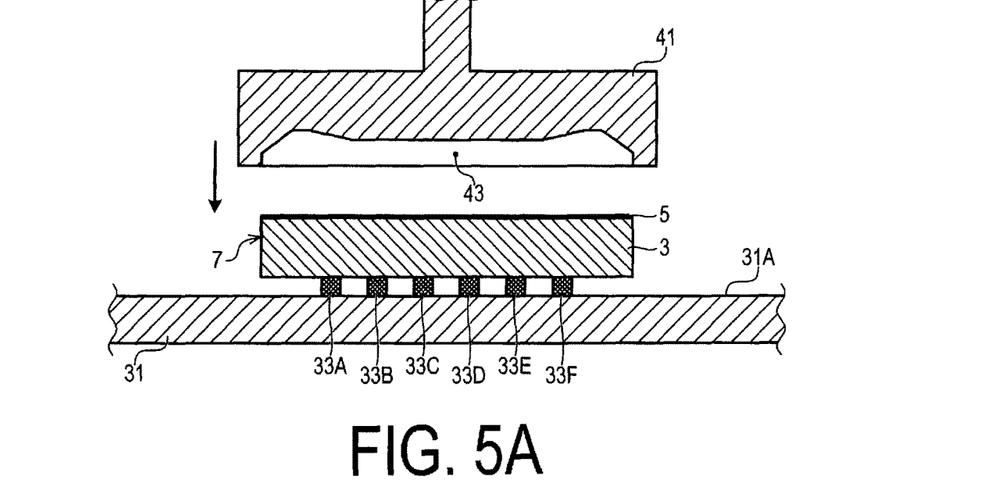
FIG. 5A is an explanatory diagram illustrating a state before the laminate is attached to an electronic circuit board.

More specifically, as illustrated in FIG. 5A, for example, when a plurality of chip-type electronic parts 33A, 33B, 33C, 33D, 33E, and 33F (corresponding to examples of the heat-generating parts described in the present disclosure) are mounted on an electronic circuit board 31 (corresponding to an example of the first member described in the present disclosure), a laminate 7 is disposed so as to be laminated on the electronic parts 33A, 33B, 33C, 33D, 33E, and 33F. At this time, the resin layer 3 side of the laminate 7 faces the mounting surface 31A of the electronic circuit board 31.

Figure 5B:
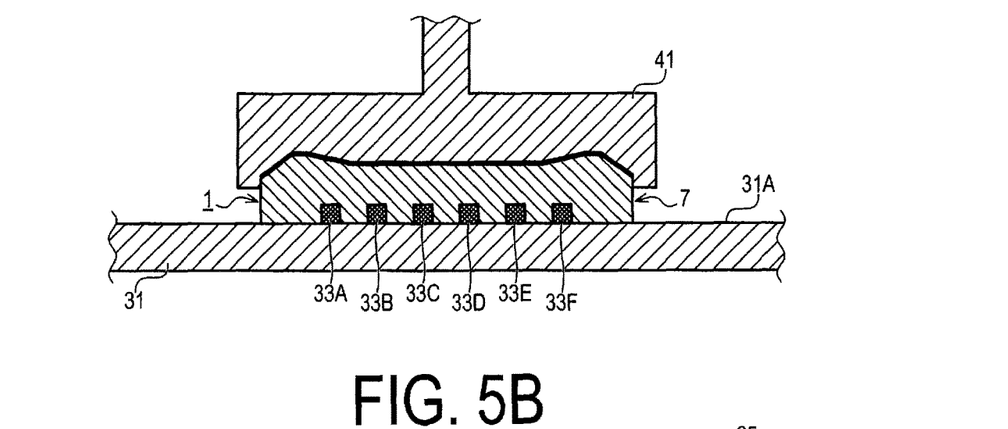
FIG. 5B is an explanatory diagram illustrating a state in which the laminate is attached to an electronic circuit board so as to form a heat conduction member having a prescribed shape.

Next, a jig 41 is displaced in the direction indicated by the arrow in FIG. 5A so as to press a concave part 43 of the jig 41 against the metal layer 5 side of the laminate 7. The shape of the inside surface of the concave part 43 is formed by inverting the concavities and convexities of the heat conduction member 1 having a prescribed shape, and when such a concave part 43 is pressed against the laminate 7, the metal layer 5 side of the laminate 7 is embossed into a prescribed shape, as illustrated in FIG. 5B. In addition, at this time, the electronic parts 33A, 33B, 33C, 33D, 33E, and 33F sink into the body of the resin layer 3 so that the resin layer 3 adheres to the mounting surface 31A of the electronic circuit board 31 and the electronic parts 33.

Figure 5C:
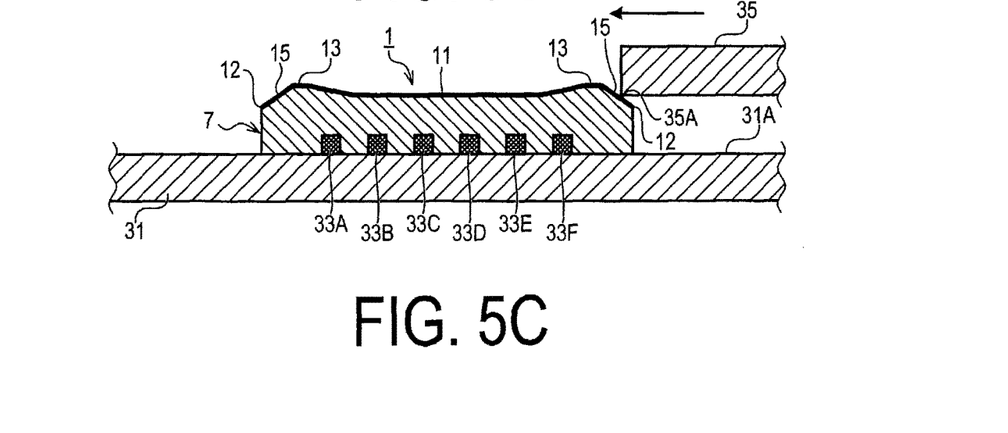
FIG. 5C is an explanatory diagram illustrating a state at the moment when a second member comes into contact with the heat conduction member.

As a result, as illustrated in FIG. 5C, the height of the laminate 7 from the mounting surface 31A at the peripheral edge 12 of the laminate 7 is smaller than in the center portion of the laminate 7, and the height of the laminate 7 from the mounting surface 31A in the intermediate portion 13 between the center portion 11 and the peripheral edge 12 of the laminate 7 is greater than in the center portion 11 of the laminate 7. In addition, an inclined surface 15 is formed in the range from the intermediate portion 13 to the peripheral edge 12 of the laminate 7 so as to form a falling gradient from the intermediate portion 13 toward the peripheral edge 12 while the metal layer 5 side faces upward. That is, by means of embossing using a jig 41 such as that described above, a heat conduction member 1 having a prescribed shape is formed on the electronic circuit board 31. Note that the structure formed by such an electronic circuit board 31, electronic parts 33A, 33B, 33C, 33D, 33E, and 33F, and heat conduction member 1 corresponds to an example of the heat conduction structure described in the present disclosure.

Accordingly, as in the example described above, when the panel 35 (corresponding to an example of the second member described in the present disclosure) makes contact with the heat conduction member 1, the slide direction tip part 35A of the panel 35 makes contact with the inclined surface 15 of the heat conduction member 1. Therefore, the slide direction tip part 35A of the panel 35 does not get caught on the end face of the heat conduction member 1. Accordingly, the metal layer 5 does not turn up as the panel 35 and the metal layer 5 make contact, and the metal layer 5 can be properly brought into contact with the panel 35. Therefore, the heat conduction member 1 can be made to exhibit good heat conduction performance in comparison to a flat heat conduction member in which the metal layer 5 tends to turn up.

Although an illustration of this example is omitted, when the heat conduction member 1 is sandwiched between the electronic circuit board 31 and the panel 35, the heat conduction member 1 is compressed and deformed in the same manner as in the example described above (see FIG. 3B). Therefore, the height of the laminate 7 from the mounting surface 31A is greater in the intermediate portion 13 of the laminate 7 than in the center portion 11 of the laminate 7, so it is possible to increase the adhesion with respect to the panel 35 and to enhance the heat conduction performance. In addition, when the intermediate portion 13 is pressed and crushed by the panel 35, the density of the resin layer 3 becomes high in this portion, and the thermal conductivity of this portion is enhanced, which makes it possible to enhance the heat conduction performance.

Other Embodiments

An exemplary embodiment has been used to describe the heat conduction member, but this embodiment should not be construed to be any more than an example of one form of the present disclosure. In other words, the present disclosure is not limited to the exemplary embodiment described above and can be embodied in various forms without departing from the technical concept of the present disclosure.

For example, in the embodiments described above, it was described that the metal layer 5 is formed from aluminum or an aluminum alloy, but another metal may also be used. For example, copper, a copper alloy, or the like may be used.

In addition, in the embodiments described above, the electronic parts 33, 33A, 33B, 33C, 33D, 33E, and 33F, which themselves generate heat, were illustrated as examples of heat-generating parts, but the heat conduction member 1 described above may also be applied to heat-generating parts which generate heat with the heat transmitted from other heat sources. That is, the heat-generating part described in the present disclosure is not limited to a heat-generating part which itself generates heat.

In addition, in the embodiments described above, the thickness of the resin layer 3, the thickness of the metal layer 5, the hardness of the resin layer 3, and the like were explained using specific examples of numerical values, but these numerical values may vary within the ranges defined by the present disclosure. That is, all of the modes included in the technical ideas specified from the text of the Scope of the patent Claims fall under the category of embodiments of the present disclosure.

Supplementary Description

Note that as is clear from the exemplary embodiments described above, the heat conduction member of the present disclosure may be further provided with configurations such as those given below. First, in the heat conduction member of the present disclosure, the hardness of the resin layer may be not less than 5 and not greater than 40 in terms of Asker C hardness; the thickness of the metal layer may be not less than 100 µm and not greater than 500 µm; and the thickness of the resin layer in the center portion of the laminate may be not less than 1 mm and not greater than 3 mm.

With a heat conduction member configured in this way, the hardness of the resin layer, the thickness of the resin layer, and the hardness of the metal layer are respectively set as described above, so the shape of the heat conduction member can be easily formed into a prescribed shape with the production method described above.

In addition, in the heat conduction member of the present disclosure, the resin layer may be configured so that the face on the opposite side as the metal layer is flat, and the inclined surface may be configured so as to form a slope of not less than 20 degrees and not greater than 50 degrees with respect to the face formed into a flat shape.

With a heat conduction member configured in this way, the resin layer is configured so that the face on the opposite side of the metal layer is flat, so it is possible to achieve the attachment or the like to a heat-generating member by using the face formed into a flat shape. In addition, the inclined surface of the metal layer is configured so as to form a slope of not less than 20 degrees and not greater than 50 degrees with respect to the face formed into a flat shape, so the panel described above does not get caught on the end face of the metal layer. Accordingly, the metal layer does not turn up as the panel and the metal layer make contact, and the metal layer can be properly brought into contact with the panel, so the heat conduction member can be made to exhibit good heat conduction performance.

In addition, in the heat conduction member of the present disclosure, the metal layer may be formed from aluminum or an aluminum alloy.

With a heat conduction member configured in this way, the metal layer is formed from aluminum or an aluminum alloy, so the thermal conductivity of the metal layer can be enhanced.

What is claimed is:

1. A heat conduction member comprising:
   a laminate formed by laminating a resin layer and a metal layer;
   the resin layer being formed from a thermally conductive resin material prepared by forming a compound from a thermally conductive filler added to a resin material serving as a base material;
   a thickness of the laminate being smaller at a peripheral edge of the laminate than in a center portion of the laminate;
   a thickness of the laminate being greater in an intermediate portion between the center portion and the peripheral edge of the laminate than in the center portion of the laminate; and
   an inclined surface being formed in a range from the intermediate portion to the peripheral edge of the laminate so as to form a falling gradient from the intermediate portion toward the peripheral edge while the metal layer side faces upward.

2. The heat conduction member according to claim 1, wherein
   the hardness of the resin layer is not less than 5 and not greater than 40 in terms of Asker C hardness;
   the thickness of the metal layer is not less than 100 µm and not greater than 500 µm; and
   the thickness of the resin layer in the center portion of the laminate is not less than 1 mm and not greater than 3 mm.

3. The heat conduction member according to claim 1, wherein the laminate is configured so that a face on the resin layer side is flat, and the inclined surface is configured so as to form a slope of not less than 20 degrees and not greater than 50 degrees with respect to the face formed into a flat shape.

4. The heat conduction member according to claim 1, wherein the metal layer is formed from aluminum or an aluminum alloy.

5. A production method for a heat conduction comprising:
   a first step of producing a composite sheet by laminating a resin sheet formed from a thermally conductive resin material prepared by forming a compound from a thermally conductive filler added to a resin material serving as a base material, a thickness being not less than 1 mm and not greater than 3 mm, and a hardness of the sheet being not less than 5 and not greater than 40 in terms of Asker C hardness, and a metal sheet having a thickness of not less than 100 µm and not greater than 500 µm; and
   a second step of producing a plurality of laminates by pressing a blade into the composite sheet toward the lamination direction from the metal sheet side and cutting the composite sheet so that each laminate has a structure in which the resin layer and the metal layer are laminated;

in the second step, a thickness of the laminate being smaller at a peripheral edge of the laminate than in a center portion of the laminate;

a thickness of the laminate being greater in an intermediate portion between the center portion and the peripheral edge of the laminate than in the center portion of the laminate; and an inclined surface being formed in a range from the intermediate portion to the peripheral edge of the laminate so as to form a falling gradient from the intermediate portion toward the peripheral edge while the metal layer side faces upward.

6. A heat conduction structure comprising:

a first member having a heat-generating part on at least one face thereof, and a heat conduction member attached to the first member so as to make contact with the heat-generating part;

the heat conduction member comprising a laminate formed by laminating a resin layer and a metal layer;

the resin layer being formed from a thermally conductive resin material prepared by forming a compound from a thermally conductive filler added to a resin material serving as a base material;

the heat conduction member being configured so as to make contact with the heat-generating part and the first member on a resin layer side and so that it can make contact with a second member on a metal layer side;

the heat conduction member having a shape so that, when the metal layer side faces upward while the heat conduction member is attached to the first member, a peripheral edge of the laminate is disposed at a position lower than a center portion of the laminate, and an intermediate portion between the center portion and the peripheral edge of the laminate is disposed at a higher position than the center portion of the laminate; and an inclined surface being formed in a range from the intermediate portion to the peripheral edge of the laminate so as to form a falling gradient from the intermediate portion of the laminate toward the peripheral edge while the metal layer side faces upward.

7. The heat conduction member according to claim 2, wherein the laminate is configured so that the face on the resin layer side is flat, and the inclined surface is configured so as to form a slope of not less than 20 degrees and not greater than 50 degrees with respect to the face formed into a flat shape.

8. The heat conduction member according to claim 2, wherein the metal layer is formed from aluminum or an aluminum alloy.

9. The heat conduction member according to claim 3, wherein the metal layer is formed from aluminum or an aluminum alloy.

10. The heat conduction member according to claim 7, wherein the metal layer is formed from aluminum or an aluminum alloy.

* * * * *